US007214995B2

(12) United States Patent
Chou et al.

(10) Patent No.: US 7,214,995 B2
(45) Date of Patent: May 8, 2007

(54) MECHANISM TO PREVENT ACTUATION CHARGING IN MICROELECTROMECHANICAL ACTUATORS

(75) Inventors: Tsung-Kuan Allen Chou, San Jose, CA (US); Quan A. Tran, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 299 days.

(21) Appl. No.: 10/955,153

(22) Filed: Sep. 30, 2004

(65) Prior Publication Data

US 2006/0065942 A1 Mar. 30, 2006

(51) Int. Cl.
*H01L 29/82* (2006.01)

(52) U.S. Cl. ...................... 257/415; 257/419; 257/420; 257/618; 257/619

(58) Field of Classification Search ..................... None
See application file for complete search history.

(56) References Cited

U.S. PATENT DOCUMENTS

2002/0135440 A1 * 9/2002 Ryhanen et al. ............ 333/185

OTHER PUBLICATIONS

U.S. Appl. No. 10/812,900, filed Mar. 31, 2004, Chou et al.

* cited by examiner

*Primary Examiner*—Evan Pert
*Assistant Examiner*—Tan Tran
(74) *Attorney, Agent, or Firm*—Blakely, Sokoloff, Taylor & Zafman LLP

(57) ABSTRACT

According to one embodiment a microelectromechanical (MEMS) switch is disclosed. The MEMS switch includes a top movable electrode, and an actutaion electrode with an undoped polysilicon stopper region to contact the top movable electrode when an actuation current is applied. The undoped polysilicon stopper region prevents actuation charging that accumulates over time in a unipolar actuation condition.

21 Claims, 13 Drawing Sheets

MECHANISM TO PREVENT ACTUATION CHARGING IN MICROELECTROMECHANICAL ACTUATORS

FIELD OF THE INVENTION

The present embodiments of the invention relate generally to micro-electromechanical systems (MEMS) and, more specifically, relate to a MEMS switch.

BACKGROUND

Micro-electromechanical systems (MEMS) devices have a wide variety of applications and are prevalent in commercial products. One type of MEMS device is a MEMS radio frequency (RF) switch. A typical MEMS RF switch includes one or more MEMS switches arranged in an RF switch array. MEMS RF switches are ideal for wireless devices because of their low power characteristics and ability to operate in radio frequency ranges. MEMS RF switches show their promising applications in cellular telephones, wireless computer networks, communication systems, and radar systems. In wireless devices, MEMS RF switches may be used as antenna switches, mode switches, and transmit/receive switches.

Traditionally, in MEMS switch architecture, dielectric such as oxide or nitride is used on the actuation electrode to prevent electric short when the movable top electrode makes contact with the actuation electrode. However, in a unipolar actuation condition, where voltage is applied in the same polarity, charges are constantly trapped in the non-conductive dielectric and accumulate there over time. This phenomenon is known as “actuation charging”. The result of actuation charging is device failure because the trapped charges produce adequate electrostatic force to hold the movable electrode closed.

In order to prevent the actuation charging problem in MEMS switches, bipolar actuation has been used to retrieve charges injected into the dielectric with the opposite polarized voltage. However, such an approach requires a special and expensive bipolar actuation chip design, sometimes costing more than the MEMS device itself.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A mechanism to prevent actuation charging in a MEMS switch is described. Reference in the specification to “one embodiment” or “an embodiment” means that a particular feature, structure, or characteristic described in connection with the embodiment is included in at least one embodiment of the invention. The appearances of the phrase “in one embodiment” in various places in the specification are not necessarily all referring to the same embodiment.

In the following description, numerous details are set forth. It will be apparent, however, to one skilled in the art, that the embodiments of the invention may be practiced without these specific details. In other instances, well-known structures and devices are shown in block diagram form, rather than in detail, in order to avoid obscuring the present invention.

Figure 1:
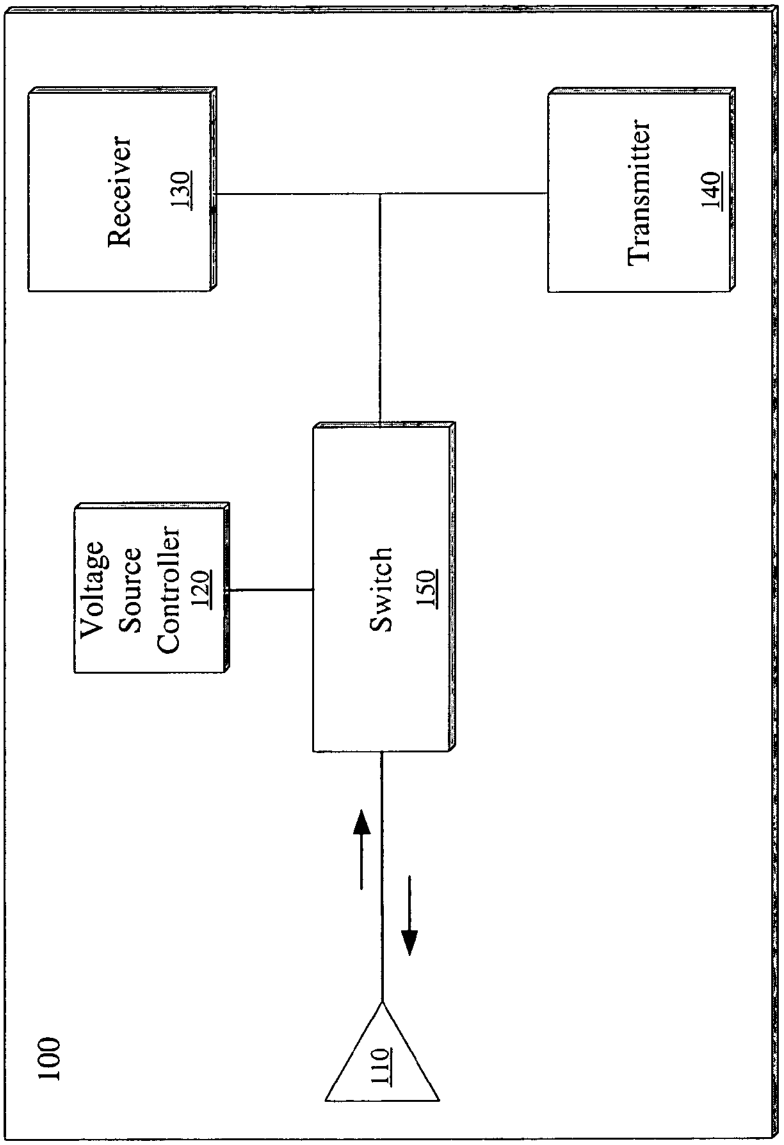
FIG. 1 illustrates one embodiment of a wireless communications system.

FIG. 1 is a block diagram of one embodiment of a wireless communication system 100. System 100 includes an antenna 110 for transmitting and receiving signals. System 100 also includes a voltage source controller 120, a receiver 130 a transmitter 140, and a MEMS switch 150 electrically coupled to antenna 110.

Voltage source controller 120 is electrically connected to MEMS switch 150. In one embodiment, voltage source controller 120 includes logic for selectively supplying voltages to actuation electrodes (not shown) within MEMS switch 150 to selectively activate switch 150. Receiver 130 processes signals that are received at system 100 via antenna 110. Transmitter 140 generates signals that are to be transmitted from system 100.

During operation, system 100 receives and transmits wireless signals. This is accomplished by voltage source controller 120 selectively activating MEMS switches 150 so that switch 150 is coupled to receiver 130 so that received signals can be transmitted from antenna 110 to receiver 130 for processing, and coupled to transmitter 140 so that transmitted signals generated by transmitter 140 can be passed to antenna 110 for transmission.

Figure 2:
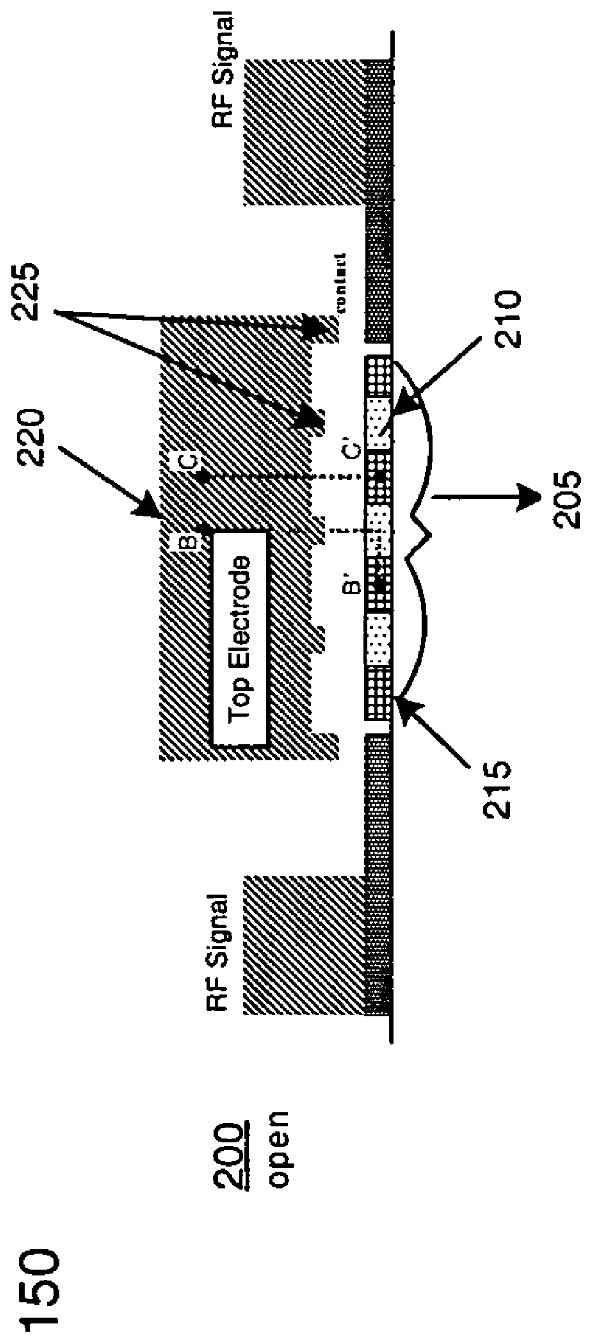
FIG. 2 illustrates one embodiment of a MEMS switch in an open state.
Figure 3:
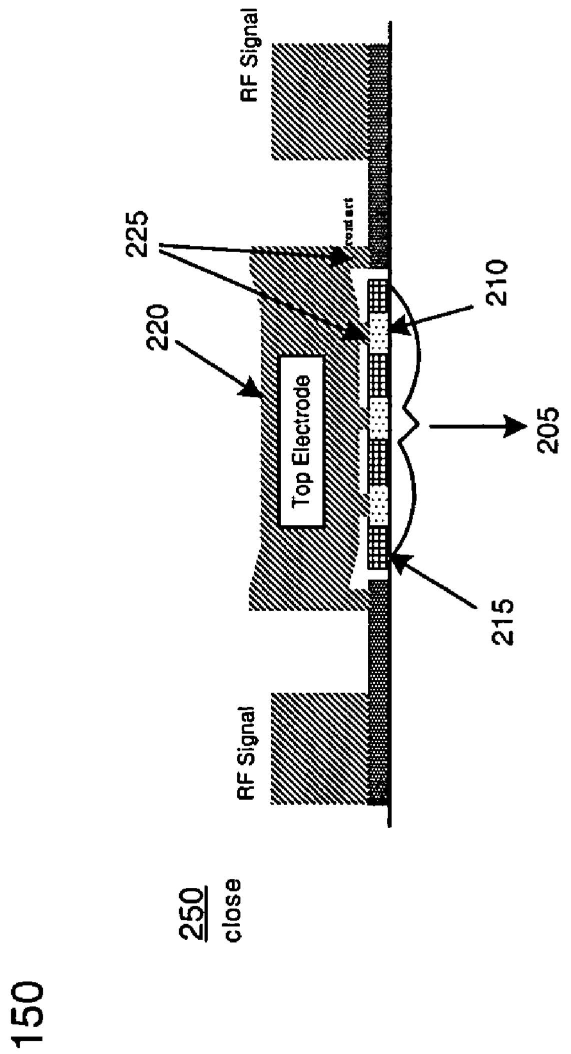
FIG. 3 illustrates one embodiment of a MEMS switch in a closed state.

FIGS. 2 and 3 illustrate one embodiment of a MEMS switch 150. In FIG. 2, switch 150 is in one depiction in an “open” state 200. In FIG. 3 switch 150 is depicted in a “closed” state 250. In one embodiment, switch 150 includes an actuation electrode 205 having an undoped polysilicon (intrinsic, i) stopper region 210, and doped (p-type or n-type) polysilicon region 215. A top movable electrode 220 may be metal (for example, gold (Au)). According to one embodiment, the top movable electrode 220 also includes at least one stopper 225. Stopper 225 will contact the undoped polysilicon region 210 of the actuation electrode 205 when actuation voltage is applied. In one embodiment, stopper 225 size and undoped polysilicon region 210 are much smaller than the size of the actuation electrode 205.

When voltage is applied to actuation electrode 205, an electrostatic force pulls down the top electrode 220, which will seize its movement when stopper 225 makes contact to the undoped polysilicon region 210 (see "closed" state 250). However, the low-resistive doped polysilicon region 215 produces the main electrostatic actuation continuously.

Using the undoped polysilicon 210 to diffuse the actuation charges reduces the actuation charging problem. These charges will drift away towards the p-type, n-type, or metal electrodes due to their semiconductor property. Therefore, no charges will build up in the updoped polysilicon 210. Only space charges in the depletion region remain as fixed charges between electrodes. However, the total amount of charges from this region does not increase over time and is too low to cause a problem.

Figure 4:
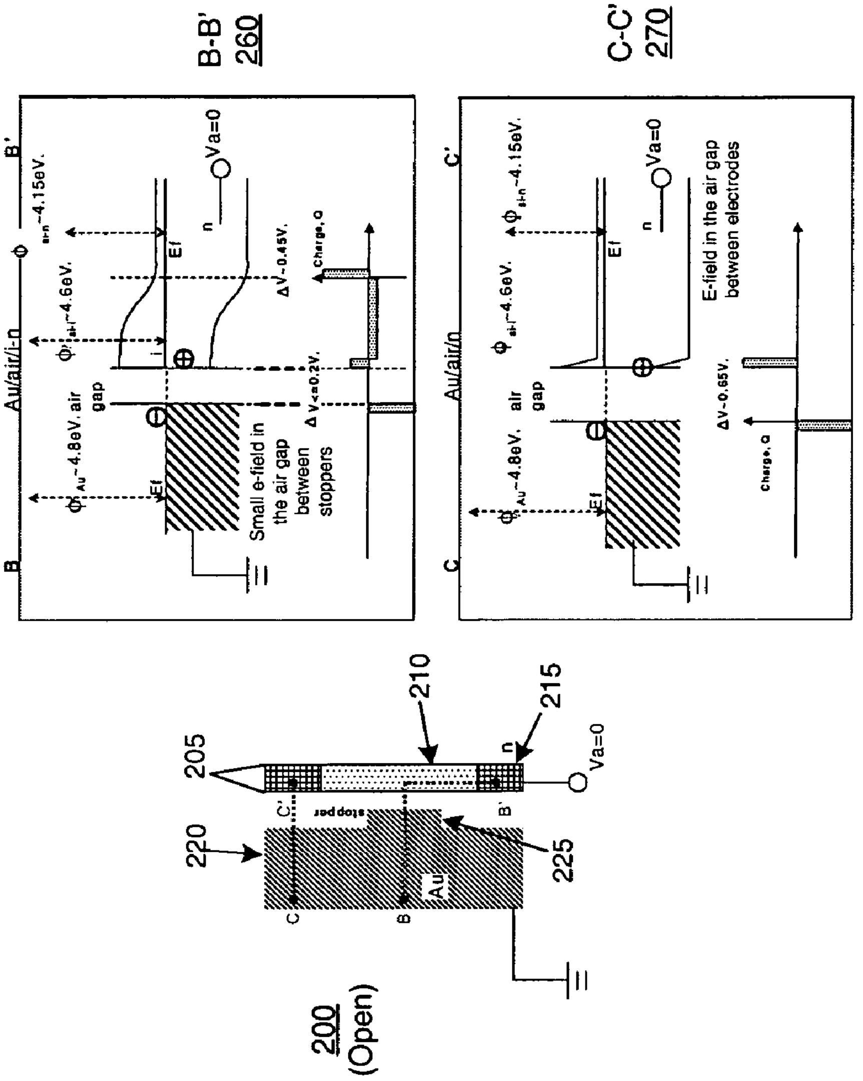
FIG. 4 is a band diagram illustrating charges and potential through one embodiment of a MEMS switch with no actuation voltage being applied.

FIG. 4 is a band diagram depicting charges and potential through one embodiment of the MEMS switch with an gold metal top electrode 220 and an actuation electrode 205 with n-type doped polysilicon (note that p-type may also be used) 215 and undoped polysilicon stopper 210 regions. This is illustrated by the magnified view of the "open" state 200 from FIG. 2. In FIG. 4 the device is not actuated or "open" ($V_a$=0). The current path through the top electrode at the actuation region is represented by C–C' (Au/air/n interface). The current path through the undoped polysilicon stopper region is represented by B–B' (Au/air/i-n interface).

The region B–B' band diagram 260 illustrates the potential at the stopper region at equilibrium. Due to the work function difference between gold and undoped polysilicon, a small potential drop between the two electrodes is anticipated (<=0.2V). The region C–C' band diagram 270 illustrates the potential at the actuation region at equilibrium. The work function difference between gold and the n-type doped polysilicon creates a small potential drop between the two electrodes (<=0.65V). These potential drops originate from the material work function difference and will not increase over actuation lifetime. The small potential should not cause a problem when the actuation is not in the same voltage range. In such cases, the restoring force of the top electrode overcomes this small potential and keeps the device open.

Figure 5:
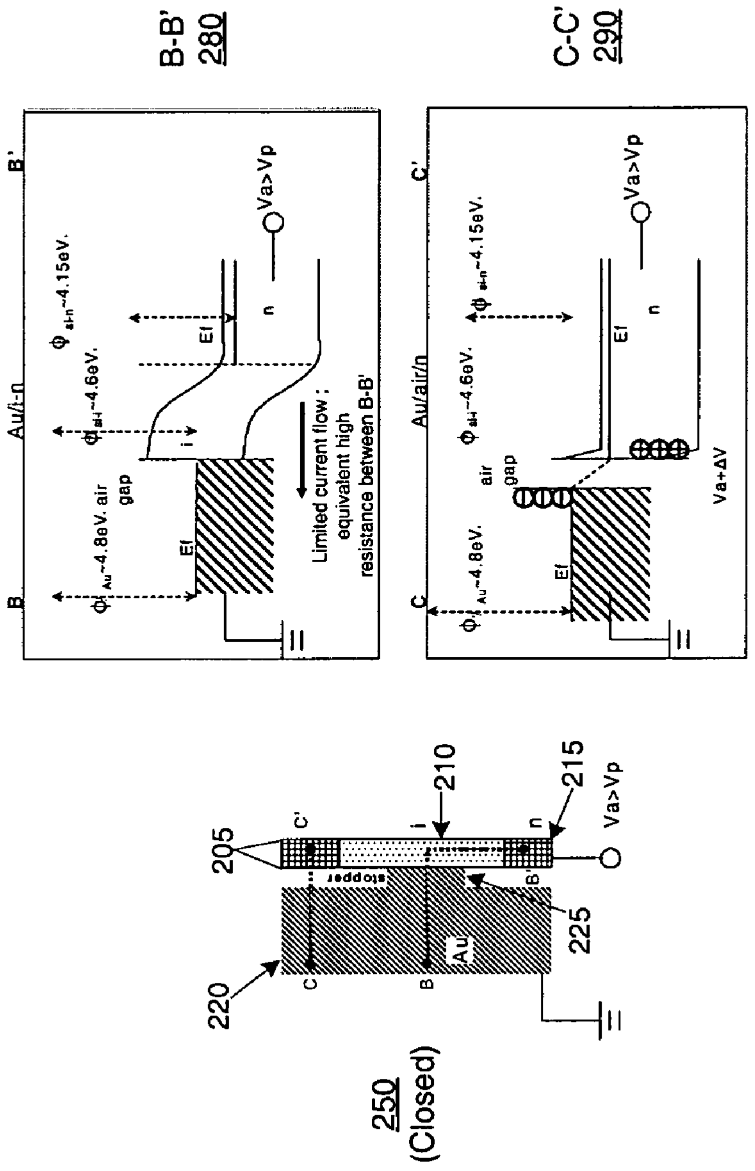
FIG. 5 is a band diagram illustrating charges and current through one embodiment of a MEMS switch with actuation voltage being applied.

FIG. 5 is a band diagram illustrating the same embodiment of MEMS switch 150 depicted in FIG. 4, except that in this figure actuation voltage is being applied ($V_a$>pull-in voltage $V_p$) and therefore switch 150 is now "closed". Top electrode 220 is pulled down and making contact to undoped polysilicon stopper region 210 of the actuation electrode 205 (illustrated by the magnified view of the "closed" state 250 from FIG. 3). The region B–B' diagram 280 depicts the results at the stopper region, which forms an Au/i-n junction with a very small contact area (<1 um). Because undoped polysilicon is used, only a very small amount of leakage current is expected to flow through the stopper region (for example, ~uA of $V_a$=5V). In a further embodiment, the Au/i-n interface is under reversed bias similar to the metal-semiconductor schottky contact, which helps reduce the risk of current flow. Furthermore, the undoped polysilicon serves as a resistor (for example, >500 k ohm) so that the actuation voltage $V_a$ remains between the two electrodes even when they make contact at the stopper region B–B'.

The region C–C' diagram 290 depicts the result at the actuation region, which forms an Au/air/n interface. The actuation voltage remains across the C–C' actuation region to keep the movable top electrode closed. Moreover, any charges that are injected into the updoped polysilicon will drift toward either electrode, which means that no trapped charges are accumulated. When the applied actuation voltage is removed, top electrode 220 will be opened by its restoring force. A small intrinsic voltage may exist as described in the FIG. 4 discussion, which should be considered in the design to ensure the restoring force overcomes this small voltage.

Figure 6:
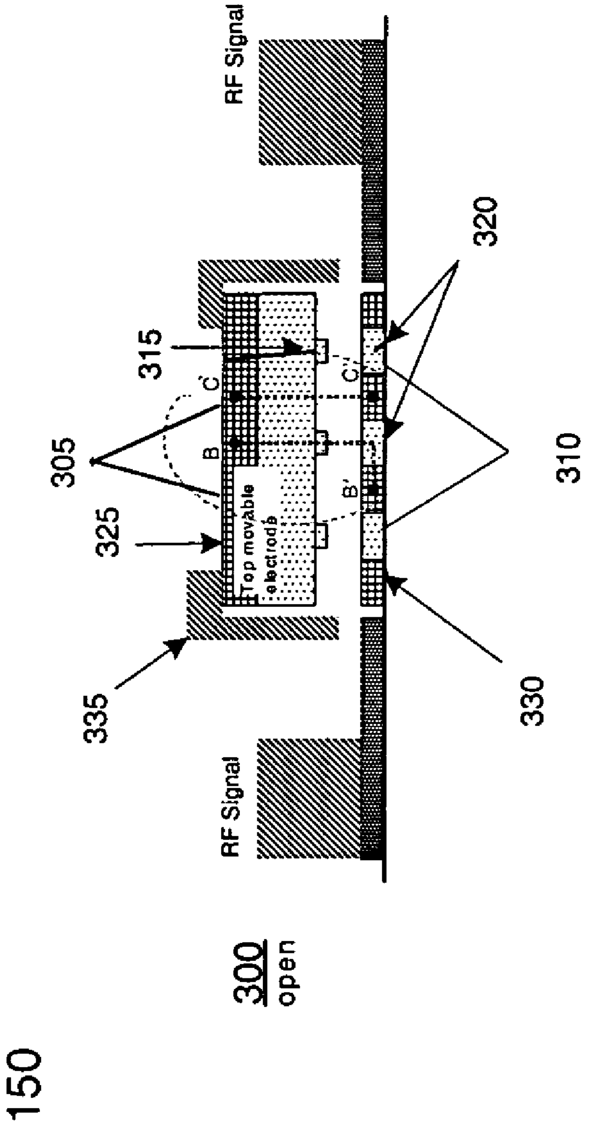
FIG. 6 illustrates another embodiment of a MEMS switch with polysilicon on both the top and actuation electrodes, in an open state.
Figure 7:
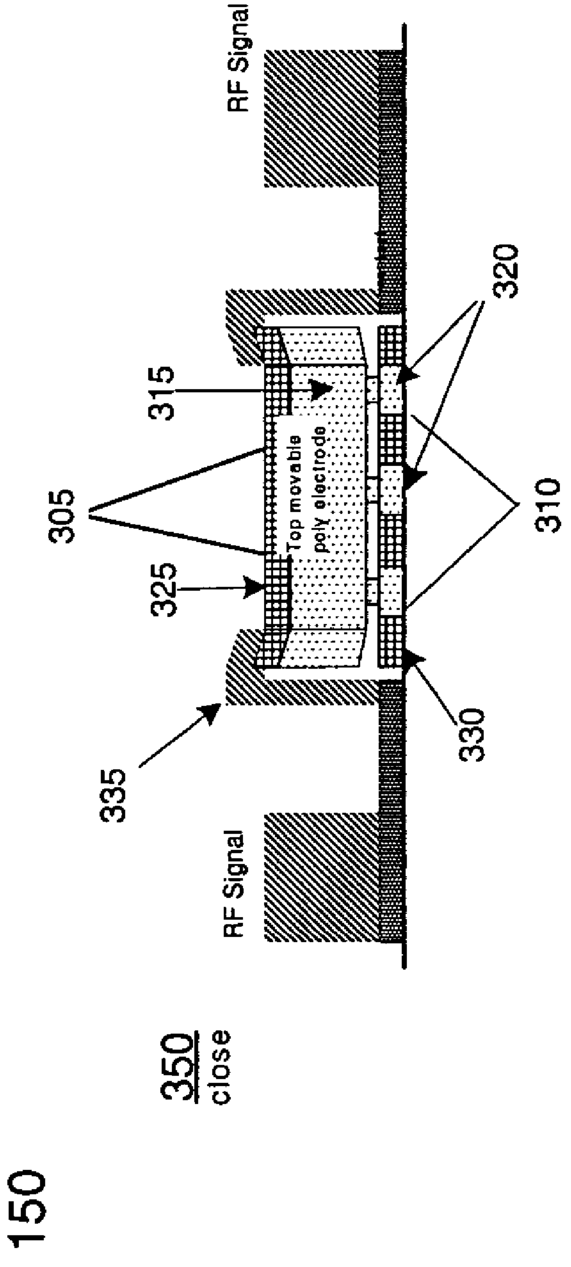
FIG. 7 illustrates another embodiment of a MEMS switch with polysilicon on both the top and actuation electrodes in a closed state.

FIGS. 6 and 7 illustrate another embodiment of MEMS switch 150, with polysilicon as both top movable 305 and actuation 310 electrodes. Undoped polysilicon stopper regions 315, 320 are found on both the top electrode 305 and the actuation electrode 310. According to one embodiment, these undoped polysilicon stopper regions 315, 320 are strategically placed so as to provide further resistance when making contact with each other. The surface 325 of the top movable electrode 305 is doped (either p-type of n-type) for actuation current conduction. Similarly regions of actuation electrode 310 are doped (either p-type or n-type) 330 for actuation current conduction. Metal (for example, gold) is used at the RF signal contact region 335 as illustrated in the drawing. The embodiment of MEMS switch 150 depicted in FIG. 6 is illustrated in an "open" state 300, while FIG. 7 shows switch 150 in a "closed" state 350.

Figure 8:
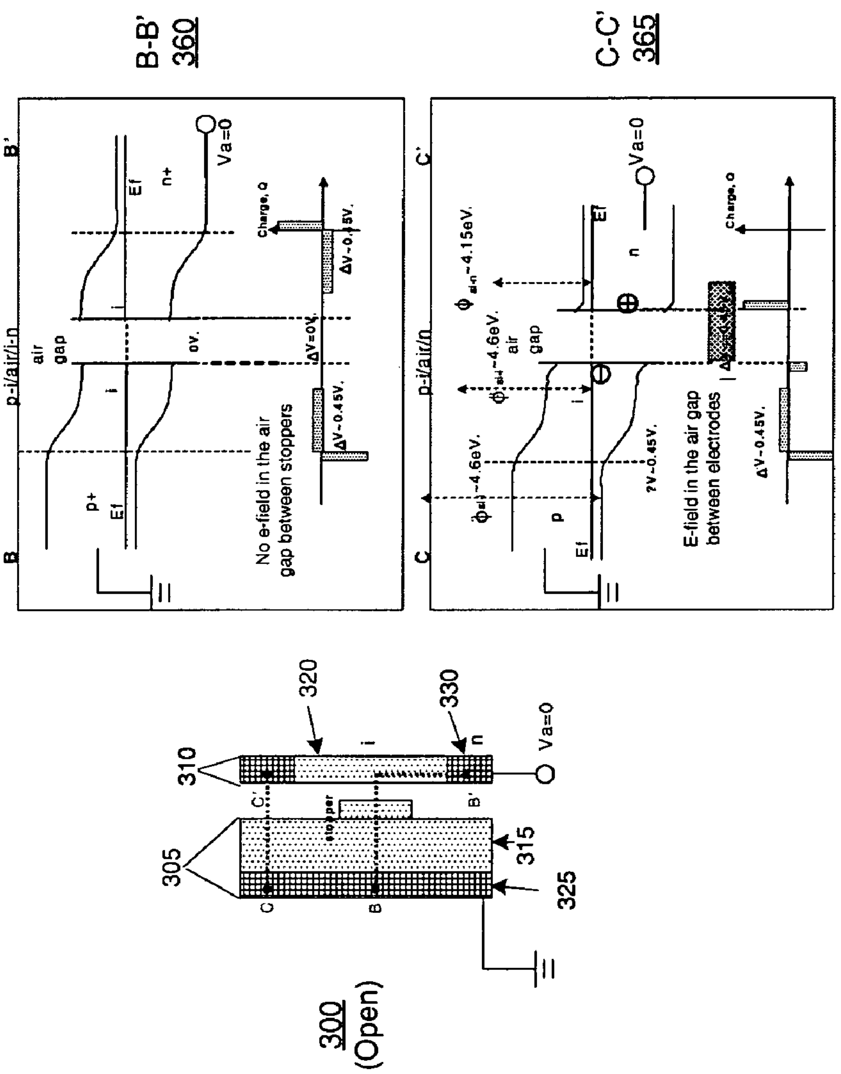
FIG. 8 is a band diagram illustrating charges and potential flow through one embodiment of a MEMS switch with no actuation voltage applied.

FIG. 8 is a band diagram depicting charges and potential through one embodiment of the MEMS switch 150 illustrated in FIG. 6. The device is not actuated (i.e., $V_a$=0) and therefore in an "open" state. A magnified view of the "open" state 300 from FIG. 6 depicts the current path at the stopper region, B–B', and also the current path at the actuation region C–C'. Here, for exemplary purposes, the doped polysilicon surface 325 on the top electrode 305 is p-type doped, and the doped polysilicon region 330 in the actuation electrode 310 is n-type doped.

The region B–B' (p-i/air/i-n interface) band diagram 360 illustrates the potential at the undoped polysilicon stopper region under equilibrium. Since undoped polysilicon is used on both electrodes 305, 310 in this region, there is no potential drop between the two electrodes. The region C–C' (p-i/air/n interface) band diagram 365 in FIG. 8 illustrates that there is potential drop from the material work function difference between the updoped polysilicon 315 and the n-type polysilicon 330 (<=0.45V).

However, the potential in this case is smaller than that for the gold top electrode illustrated in FIG. 4. Therefore, the intrinsic potential issue is reduced with the polysilicon top electrode configuration. When the actuation voltage is applied, electrostatic charges will distribute to the bottom surface of the polysilicon top electrode 305 and to the top surface of the actuation electrode 310 to produce an actuation force similar to the structure with the gold top electrode. Some change of the structure configuration may be done to eliminate the intrinsic potential from the work function difference, which will be addressed below.

Figure 9:
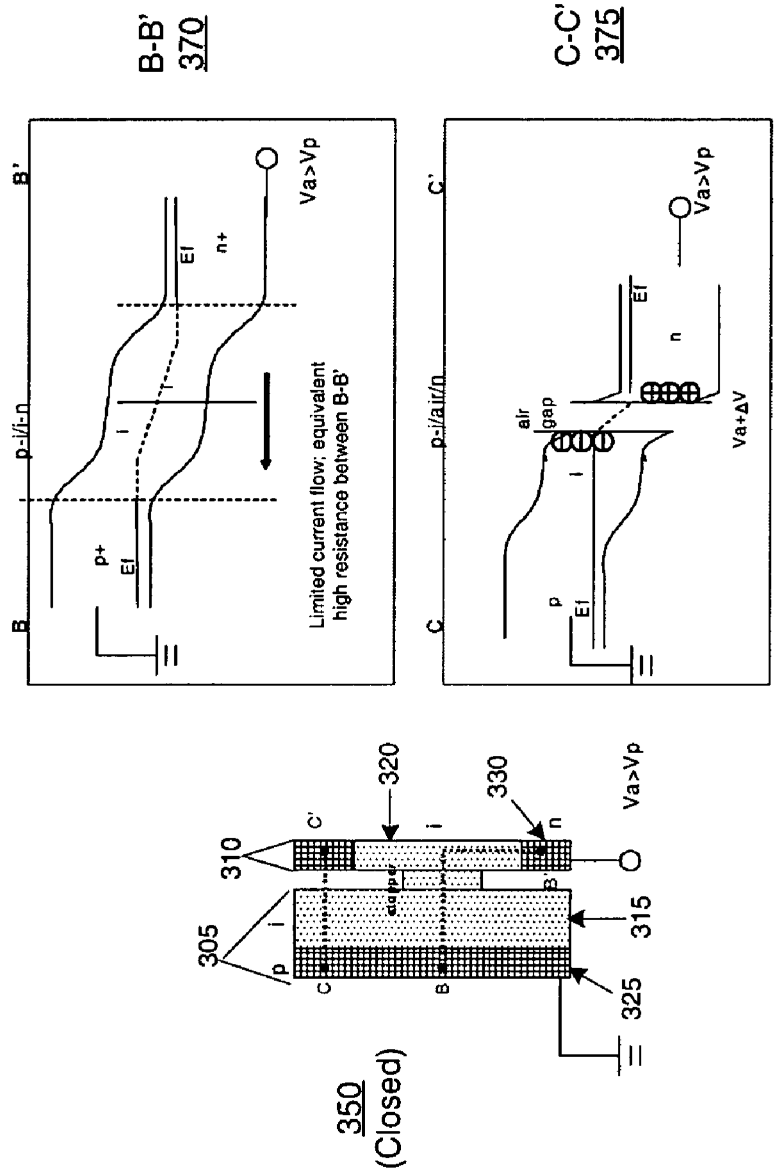
FIG. 9 is a band diagram illustrating charges and current flow through one embodiment of a MEMS switch with actuation voltage being applied.

FIG. 9 is a band diagram illustrating the same embodiment of MEMS switch 150 depicted in FIG. 8, except that in this figure actuation voltage is being applied ($V_a$>pull-in voltage $V_p$) and therefore the switch is now "closed". A magnified view of the device in the "closed" state 350, as in FIG. 7, is included. Here, as in FIG. 8, the doped polysilicon surface 325 on the top electrode 305 is p-type doped, and the doped polysilicon region 330 of the actuation electrode 310 is n-type doped. The top poly electrode 305 is pulled down and making contact at the undoped polysilicon stopper regions 315, 320 of both electrodes 305, 310.

The region B–B' band diagram 370 shows the result at the undoped stopper contact regions 315, 320, which forms a p-i/i-n interface junction with a very small contact area (actual <1 um). Because undoped polysilicon is used on both sides of the stopper contact regions 315, 320, the equivalent resistance is high and leakage current is further reduced. Furthermore, the p-i/i-n interface is under reversed bias similar to a p-n junction, which also helps to increase the resistance.

The actuation voltage across the C–C' region (p-i/air/n interface) is illustrated in the C–C' band diagram 375. The voltage is retained between the top 305 and actuation 310 electrodes. The electrostatic charges remain on the electrode surfaces to keep the movable top electrode 305 closed. Again, any charges that are injected into the updoped polysilicon 315, 320 will drift away toward either electrode, which means that no trapped charges should be accumulated. When the applied voltage is removed, the top electrode will open through its restoring force. The intrinsic voltage (<=0.45V) here is smaller than in the case with the gold top electrode (see FIG. 5). Therefore, this structure is less sensitive to its intrinsic potential.

Figure 10:
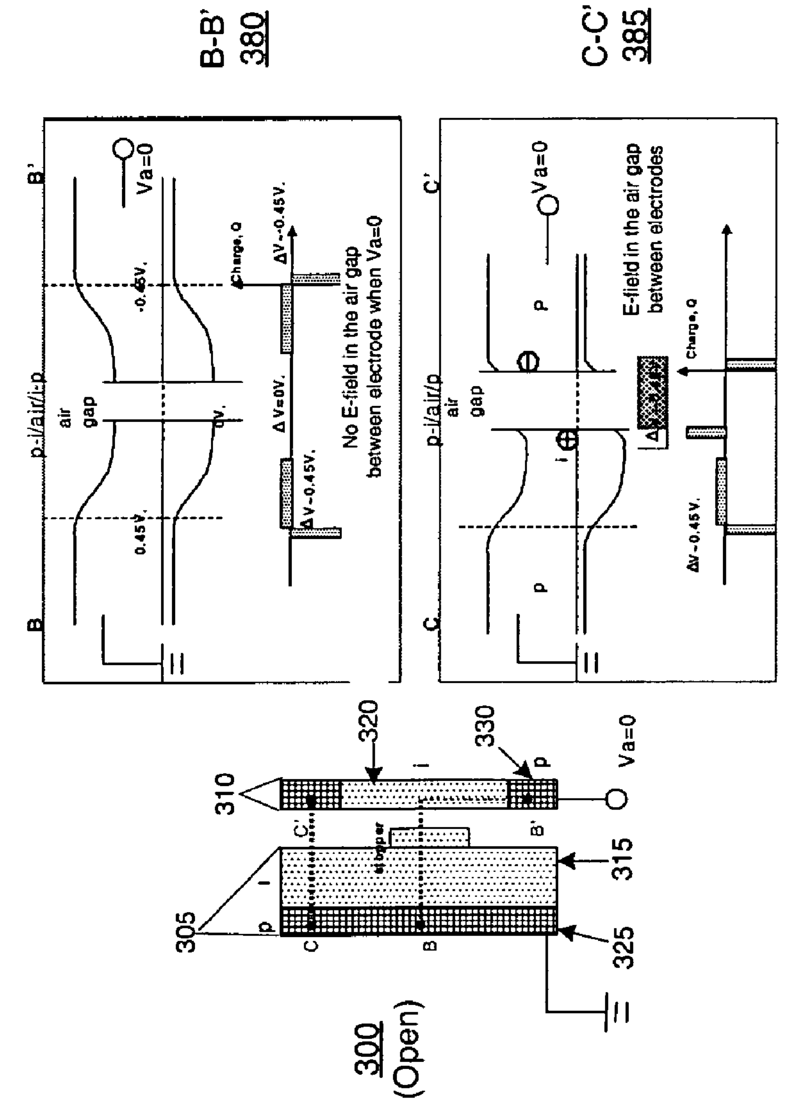
FIG. 10 is a band diagram illustrating charges and potential flow through one embodiment of a MEMS switch with no actuation voltage applied.

FIG. 10 is a band diagram illustrating another embodiment of a MEMS switch 150 similar to that depicted in FIG. 8. Here, the doped polysilicon region 330 on the actuation electrode 310 is p-type doped, instead of n-type doped. The doped silicon region 325 on the top electrode 305 remains p-type doped. The device is not actuated in this depiction (i.e., $V_a=0$). A magnified view of the "open" state 300 from FIG. 6 depicts the charges and potential at the stopper region, B–B', and also the charges and potential at the actuation region C–C'. Corresponding band diagrams illustrate the results for the B–B' path 380 and the C–C' path 385.

No potential drop is expected at the B–B' stopper region (p-i/air/i-p interface). Similar to the analysis in FIG. 8, the same undoped polysilicon 315, 320 is used on the electrodes 305, 310 on either side of the air gap, resulting in no potential drop. For the case of C–C' actuation region (p-i/air/p interface), there is still potential drop from the material work function difference between updoped 315 and p-type polysilicon 330 (<=0.45V). However, the potential is in opposite polarity from the case of p-i/air/n shown and discussed with FIG. 8.

Figure 11:
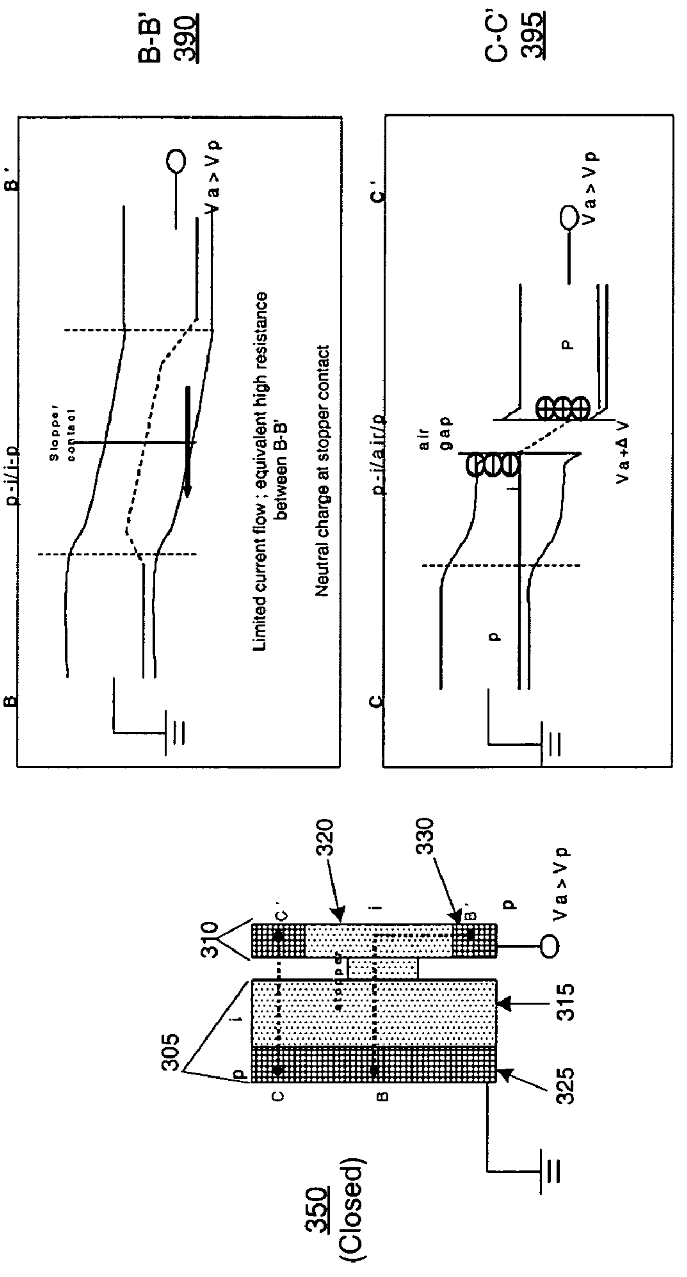
FIG. 11 is a band diagram illustrating charges and current flow through one embodiment of a MEMS switch with actuation voltage being applied.

FIG. 11 is a band diagram illustrating a similar embodiment to the MEMS switch 150 depicted in FIG. 10, except that in this embodiment actuation voltage is being applied ($V_a$>pull-in voltage $V_p$) and therefore the switch is now "closed". A magnified view of the device in the "closed" state 350 is included. Here, as in FIG. 10, the doped polysilicon surface 325 on the top electrode 305 is p-type doped, and the doped polysilicon region 330 of the actuation electrode 310 is p-type doped. The top poly electrode 305 is pulled down and making contact to the undoped polysilicon stopper regions 315, 320 of both electrodes 305, 310.

The band diagram 390 for the B–B' undoped polysilicon stopper region (p-i/i-p interface) illustrates that the undoped polysilicon acts as a resistor to reduce the risk of large current flow. With adequate small contact area found at the stopper region (and the long length of undoped polysilicon), the resistance at the stopper contact may remain very high.

The actuation voltage across the C–C' region (p-i/air/n interface), as depicted in band diagram 395, is retained between electrodes to keep the top movable electrode 305 closed. Again, any charges that are injected into the updoped polysilicon 315, 320 will drift away toward either electrode 305, 310, which means that no trapped charges should be accumulated. When the applied voltage is removed, the top electrode 305 will open by its restoring force similar to the case described in FIG. 9.

Figure 12:
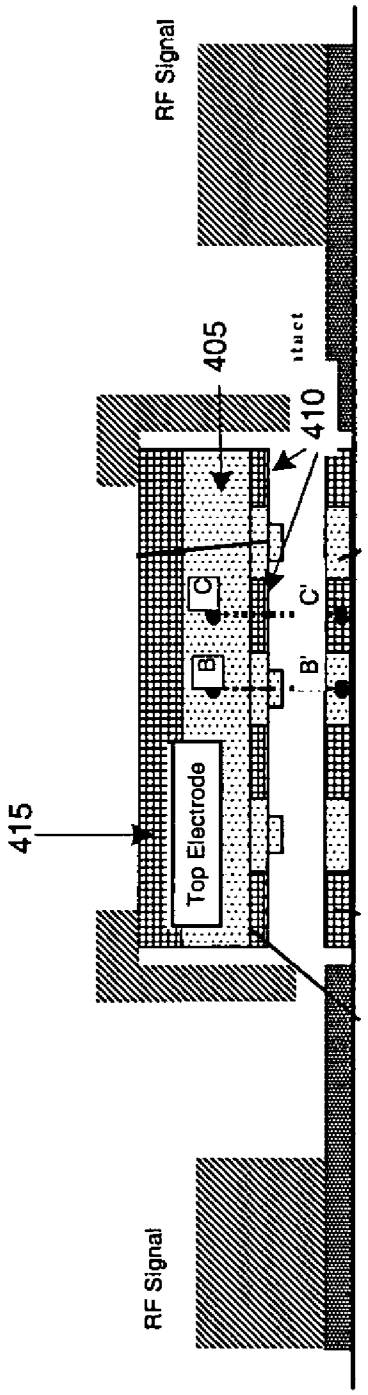
FIG. 12 illustrates one embodiment of the configuration of the top and actuation electrodes in a MEMS switch.
Figure 13:
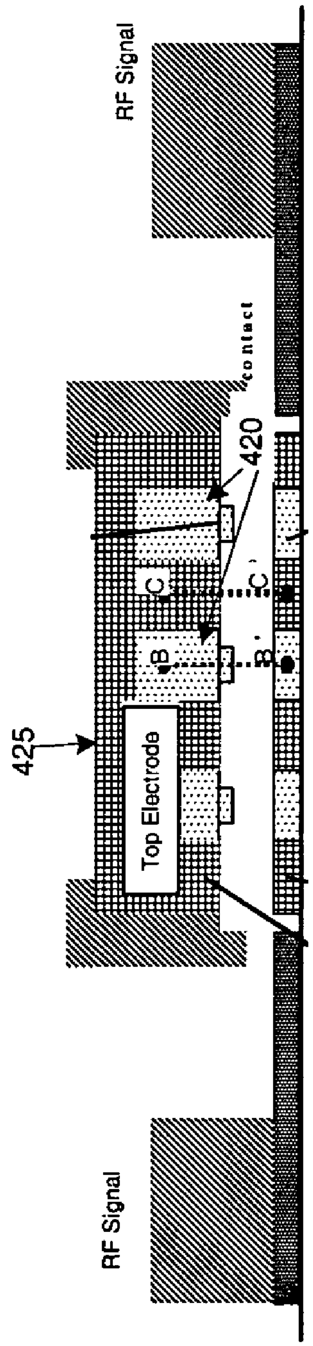
FIG. 13 illustrates one embodiment of the configuration of the top and actuation electrodes in a MEMS switch.

FIGS. 12 and 13 illustrate other embodiments of the top electrode and actuation electrode configuration, which may be implemented to reduce the intrinsic potential found in other configurations. The material work function difference from different electrode materials creates an intrinsic potential between electrodes. In most cases, the intrinsic potential may be neglected. But, for the case that the actuation voltage is in the range of the intrinsic potential (<1V), a change of the actuation configuration could be implemented to overcome such an issue. The main approach is to use the same material on both sides of the air gap as shown in both FIGS. 12 and 13. P-type polysilicon is illustrated in the drawing. N-type polysilicon may be used as well.

FIG. 12 shows that an undoped thin polysilicon is first deposited and locally p-type doped to form the desired undoped polysilicon stopper region 405 and doped polysilicon region 410 of the top polysilicon electrode. A second thick polysilicon 415 is then deposited and p-type doped for desired actuation conduction. As seen from the figure, p-type polysilicon is present on both sides of the actuation region (C–C') and undoped polysilicon is present on both sides of the stopper region (B–B'). Furthermore, the regions of undoped and doped polysilicon are symmetrically configured so that the same material always corresponds on the top electrode and actuation electrode. As a result, the intrinsic potential that arises from the work function difference between different materials is eliminated in such a configuration.

FIG. 13 shows another embodiment of the top and actuation electrode configuration that may be used to reduce intrinsic potential. The undoped polysilicon layer is first deposited and patterned to form at least one stopper region 420. Then, a thick polysilicon p-type (or n-type) doped layer 425 is deposited to form the remaining conductive top electrode. This doped polysilicon surrounds the stopper region of the undoped polysilicon on all sides of the stopper except the bottom surface. The result is similar to FIG. 12, with the same type of polysilicon material symmetrically corresponding on the top electrode and actuation electrode to reduce the intrinsic potential.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A microelectromechanical (MEMS) switch comprising:
a top electrode having at least one stopper; and
an actuation electrode having at least one undoped polysilicon stopper region to contact the stopper on the top movable electrode when actuation voltage is applied.

2. The switch of claim 1 wherein the undoped polysilicon stopper region prevents the occurrence of actuation charging.

3. The switch of claim 1 wherein the top electrode is movable.

4. The switch of claim 1 wherein the actuation electrode further comprises at least one doped polysilicon region.

5. The switch of claim 4 wherein the doped polysilicon region of the actuation electrode is n-type doped.

6. The switch of claim 4 wherein the doped polysilicon region of the actuation electrode is p-type doped.

7. The switch of claim 1 wherein the top electrode comprises metal.

8. The switch of claim 7 wherein the metal is gold.

9. The switch of claim 1 wherein the top electrode comprises:

a doped polysilicon region on the surface of the top electrode; and an undoped polysilicon stopper region on the bottom of the top electrode to contact the undoped polysilicon region of the actuation electrode when actuation voltage is applied.

10. The switch of claim 9 wherein the doped polysilicon region of the top electrode is p-type doped.

11. The switch of claim 9 wherein the doped polysilicon region of the top electrode is n-type doped.

12. The switch of claim 9 wherein the undoped polysilicon stopper region of the top electrode is locally p-type doped, to form corresponding symmetric undoped polysilicon regions on the top electrode and actuation electrode, and to form corresponding symmetric doped polysilicon regions on the top electrode and on the actuation electrode.

13. A wireless communication system comprising:

a receiver to receive high voltage RF signals;

a transmitter to transmit the high voltage RF signals;

a microelectromechanical (MEMS) switch, coupled to the receiver and the transmitter, having:

a top electrode having at least one stopper; and an actuation electrode having at least one undoped polysilicon stopper region to contact the stopper on the top movable electrode when actuation voltage is applied; and an omni directional antenna coupled to the MEMS switch.

14. The system of claim 13 wherein the top electrode is movable.

15. The system of claim 13 wherein the actuation electrode further comprises at least one doped polysilicon region.

16. The system of claim 13 wherein the undoped polysilicon stopper region prevents the occurrence of actuation charging.

17. The system of claim 13 wherein the top electrode further comprises:

a doped polysilicon region on the surface of the top electrode; and an undoped polysilicon region on the bottom of the top electrode to contact the undoped polysilicon region of the actuation electrode when actuation voltage is applied.

18. The system of claim 13 further comprising a voltage source controller coupled to the MEMS switch.

19. A method comprising:

mounting an actuation electrode on a substrate of a microelectromechanical (MEMS) switch; and integrating the actuation electrode with an undoped polysilicon stopper region to form a contact area with a stopper on a top electrode, the undoped polysilicon to prevent actuation charging at the actuation electrode.

20. The method of claim 19 further comprising integrating the top electrode with an undoped polysilicon region to prevent actuation charging.

21. The method of claim 19 wherein the top electrode is movable.

* * * * *